(12) United States Patent
Nguyen et al.

(10) Patent No.: US 9,379,738 B2
(45) Date of Patent: Jun. 28, 2016

(54) SYSTEMS AND METHODS FOR DECODING USING PARTIAL RELIABILITY INFORMATION

(71) Applicant: Marvell World Trade Ltd., St. Michael (BB)

(72) Inventors: Phong Sy Nguyen, Santa Clara, CA (US); Shashi Kiran Chilappagari, San Jose, CA (US); Dung Viet Nguyen, San Jose, CA (US)

(73) Assignee: Marvell World Trade Ltd., St. Michael (BB)

( * ) Notice: Subject to any disclaimer, the term of this patent is extended or adjusted under 35 U.S.C. 154(b) by 66 days.

(21) Appl. No.: 14/204,590

(22) Filed: Mar. 11, 2014

(65) Prior Publication Data

US 2014/0281788 A1 Sep. 18, 2014

Related U.S. Application Data

(60) Provisional application No. 61/780,325, filed on Mar. 13, 2013.

(51) Int. Cl.
| | | |
|---|---|---|
| *H03M 13/00* | (2006.01) | |
| *H03M 13/11* | (2006.01) | |
| *H03M 13/29* | (2006.01) | |
| *H04L 1/00* | (2006.01) | |
| *H03M 13/45* | (2006.01) | |
| *G11B 20/18* | (2006.01) | |

(52) U.S. Cl.
CPC .......... *H03M 13/1108* (2013.01); *H03M 13/29* (2013.01); *H04L 1/005* (2013.01); *G11B 20/1833* (2013.01); *H03M 13/45* (2013.01); *H04L 1/0045* (2013.01)

(58) Field of Classification Search
CPC ..... H03M 13/11; H03M 13/45; H03M 13/27; H03M 13/2957; H03M 13/1177; H04L 1/0045; H04L 1/005; H04L 1/0057; H04L 1/0041; G11B 20/1833; G11B 2020/185

USPC ................................................. 714/752, 780
See application file for complete search history.

(56) References Cited

U.S. PATENT DOCUMENTS

| | | | | |
|---|---|---|---|---|
| 7,752,523 B1* | 7/2010 | Chaichanavong | H03M 13/1117 | 375/262 |
| 8,291,285 B1* | 10/2012 | Varnica | H03M 13/1137 | 714/752 |
| 2005/0268204 A1* | 12/2005 | Harada | H03M 13/1111 | 714/758 |
| 2006/0020874 A1* | 1/2006 | Desai | H03M 13/2963 | 714/780 |
| 2006/0026486 A1* | 2/2006 | Richardson | H03M 13/1105 | 714/758 |
| 2008/0052558 A1* | 2/2008 | Sun | H03M 13/1105 | 714/11 |
| 2009/0222710 A1* | 9/2009 | Patapoutian | H03M 13/112 | 714/780 |
| 2010/0211847 A1* | 8/2010 | Livshitz | H03M 13/1111 | 714/752 |
| 2011/0087933 A1* | 4/2011 | Varnica | H03M 13/112 | 714/704 |
| 2013/0275827 A1* | 10/2013 | Wang | G06F 11/1076 | 714/752 |
| 2014/0040639 A1* | 2/2014 | Raam | G06F 21/606 | 713/193 |
| 2014/0068381 A1* | 3/2014 | Zhang | H03M 13/1102 | 714/770 |
| 2014/0108883 A1* | 4/2014 | Tehrani | G06F 11/1012 | 714/758 |

* cited by examiner

*Primary Examiner* — Albert Decady
*Assistant Examiner* — Osman M Alshack

(57) ABSTRACT

Systems and methods are provided for decoding data. A decoder receives a plurality of variable node values for a plurality of variable nodes and processed reliability data for at least a subset of the plurality of variable nodes. Circuitry updates the variable node values based on the variable node values and the processed reliability data. The processed reliability data represents a version of the reliability data for at least the subset of the plurality of variable nodes.

18 Claims, 5 Drawing Sheets

SYSTEMS AND METHODS FOR DECODING USING PARTIAL RELIABILITY INFORMATION

CROSS REFERENCE TO RELATED APPLICATIONS

This disclosure claims the benefit under 35 U.S.C. §119(e) of U.S. Provisional Application No. 61/780,325, filed on Mar. 13, 2013, which is incorporated herein by reference in its entirety.

FIELD OF USE

This disclosure relates generally to data decoding, and more particularly to decoders with partial reliability inputs for data encoded with a low density parity check (LDPC) encoder.

BACKGROUND

LDPC codes and decoders that are used to decode LDPC codes may be used in numerous applications and devices. For example, data storage, satellite communications, wireless communications, wire-line communications, and power-line communications are applications that may each use LDPC codes and LDPC decoders. Devices such as digital camera flash memory storage, satellites, mobile phones, and other mobile devices may also each use LDPC codes and LDPC decoders.

LDPC codes may be used for correcting errors in information transmitted in a noisy data storage or communications channel. The information may be encoded (by a LDPC encoder) prior to transmission and then subsequently decoded (by a LDPC decoder) when received. LDPC codes are one of the best performing error correction codes, along with Turbo codes, for use in correcting errors in information transmitted on communication and data storage channels.

SUMMARY

In accordance with an implementation of the disclosure, systems and methods are provided for decoding data. A plurality of variable node values for a plurality of variable nodes and processed reliability data for at least a subset of the plurality of variable nodes are received. The variable node values are updated based on the variable node values and the processed reliability data. The processed reliability data represents a version of reliability data for at least the subset of the plurality of variable nodes.

Reliability data may be stored in a memory and may be compressed to obtain the processed reliability data. A lossless compression scheme may be used to compress the reliability data to obtain the processed reliability data. Alternatively, a lossy compression scheme may be used to compress the reliability data to obtain the processed reliability data. In some implementations, a subset of the reliability data is selected to obtain the processed reliability data. A remaining portion of the reliability data may be treated as a set of erasures during the decoding.

In accordance with an implementation of the disclosure, a decoder receives a plurality of variable node values for a plurality of variable nodes and processed reliability data for at least a subset of the plurality of variable nodes. Circuitry updates the variable node values based on the variable node values and the processed reliability data. The processed reliability data represents a version of the reliability data for at least the subset of the plurality of variable nodes.

The reliability data may be stored in a memory and the reliability data may be compressed to obtain the processed reliability data. The reliability data may be compressed using a lossless compression scheme to obtain the processed reliability data. Alternatively, the reliability data is compressed using a lossy compression scheme to obtain the processed reliability data. In some implementations, a subset of the reliability data is selected to obtain the processed reliability data. The decoder may treat a remaining portion of the reliability data as a set of erasures.

In some implementations, the decoder is a low density parity check decoder, and the reliability data is stored on a cache of a NAND flash device.

In accordance with an implementation of the disclosure, a method provides processed reliability data to a decoder. The method comprises receiving reliability data for a plurality of variable nodes, processing the reliability data to obtain a processed version of the reliability data for the plurality of variable nodes, and transmitting the processed version of the reliability data to a decoder.

BRIEF DESCRIPTION OF THE DRAWINGS

The above and other features of the present disclosure, including its nature and its various advantages, will be more apparent upon consideration of the following detailed description, taken in conjunction with the accompanying drawings in which.

DETAILED DESCRIPTION

This disclosure generally relates to performing decoding at a decoder. To provide an overall understanding of the disclosure, certain illustrative embodiments will now be described, including a decoder that decodes a codeword based on processed reliability information. However, it will be understood by one of ordinary skill in the art that the systems and methods described herein may be adapted and modified as is appropriate for the application being addressed, and that the systems and methods described herein may be employed in other suitable applications, and that such other additions and modifications will not depart from the scope thereof.

Figure 1:
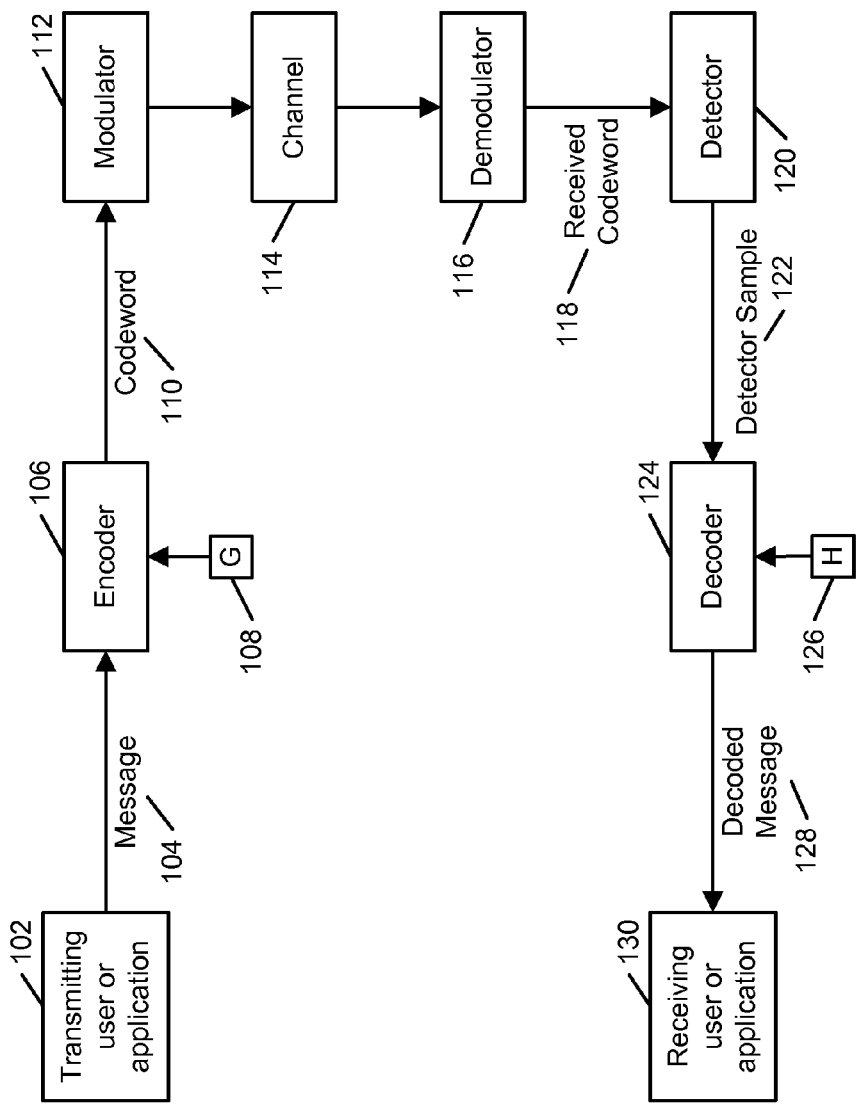
FIG. 1 is a block diagram of an illustrative communications system employing LDPC decoding, in accordance with an embodiment of the present disclosure.

FIG. 1 shows an illustrative communications system 100 for LDPC decoding based, in part, on reliability inputs, in accordance with some embodiments of the present disclosure. A communications system 100 is used to transmit information from a transmitting user or application 102 to a receiving user or application 130. The transmitting user or application 102 represents an object or entity that produces information. For example, the transmitting user or application 102 may correspond to a software program in a computer system or to a component of a wireless communications transmitter in a radio system. The transmitting user or application 102 produces information in the form of a data stream, and the data stream may be represented by a sequence of symbol values that have been pre-processed by, for example, a source encoder (not shown in FIG. 1). The information produced by the transmitting user or application 102 may correspond to voice information, video information, financial information, or any other type of information that may be represented in digital or analog form, and the data stream produced by transmitting user or application 102 may be a digital data stream.

The transmitting user or application 102 may segment or otherwise divide the data stream into blocks of a fixed length of k symbols. In particular, a message 104, also referred to as m, represents one of these blocks. In particular, the message 104 is k symbols in length, where each symbol may be binary data or non-binary data such as ternary data, quaternary data, any other suitable type of data, or any suitable combination thereof. An encoder 106 is used to encode the message 104 to produce a codeword 110. In one embodiment of the present disclosure, the encoder 106 is an LDPC encoder. However, based on the disclosure and teachings provided herein, it should be clear that the encoder 106 may be any other suitable encoder. The codeword 110, also referred to as c, has a length of n symbols, where n>k. The encoder 106 uses a generator matrix G 108, also referred to as G for notational convenience, to produce the codeword 110. For example, the encoder 106 may perform one or more matrix operations to convert the message 104 into the codeword 110. In an embodiment, the encoder 106 produces the codeword 110 from the message 104 using the generator matrix G 108 by the following matrix multiplication $\underline{c} = G\underline{m}$.

The codeword 110 may be modulated or otherwise transformed by a modulator 112 into a waveform suitable for transmission and/or storage on a channel 114. For example, the waveform may correspond to an analog Binary Phase-Shift Keying (BPSK) signal, analog Phase-Shift Keying (PSK) signal, analog Frequency-Shift Keying (FSK) signal, analog Quadrature Amplitude Modulation (QAM) signal, or any other suitable analog or digital signal.

The channel 114 refers to the physical medium through which the transmitted waveform passes, or is stored on, before being recovered at a demodulator 116. For example, the channel 114 may be a storage channel that represents a storage medium in a computer system environment, or a communications channel that represents the wireless propagation environment in a wireless communications environment. Various characteristics of the channel 114 may corrupt data that is communicated or stored thereon. For example, the channel 114 may be a non-ideal memoryless channel or a channel with memory; the channel 114 may be an erasure channel, and may be symmetric or asymmetric. The output of the channel 114 is demodulated and processed by the demodulator 116 to produce a received codeword 118. The demodulator 116 may use frequency filters, multiplication and integration by periodic functions, and/or any other suitable demodulation technique to demodulate and/or process the output of the channel 114.

The received codeword 118 contains information related to the codeword 110 and may be a corrupted or otherwise altered version of the codeword 110 originally output by the encoder 106. For example, the received codeword 118 may contain a preliminary estimate or noisy version of the codeword 110, a probability distribution vector of possible values of the codeword produced by the encoder 106, or combinations of these as well as other values.

A detector 120 is used to process the received codeword 118 to produce a detector sample 122, which may be an estimate of the original data message 104, also referred to herein as one or more hard decisions. The detector 120 samples each symbol in the received codeword 118 and assigns each symbol to a bin based on the symbol's value. In some embodiments, the bin is assigned based on a probability distribution. Each symbol sampled by the detector 120 may be assigned to one of two or more possible bins, or states. The states that are determined for the detector sample 122 are stored in memory as the sample codeword. This memory is termed the "hard decision memory," which may be in a different memory location from the received codeword 118.

In some embodiments, the channel 114 is read multiple times, and the multiple reads may be processed jointly or separately by the demodulator 116, the detector 120, or both to generate reliability data in addition to the hard decision sample codeword. For example, to determine the input state of a given symbol stored in a flash memory storage device, the memory cell in which the received value of the symbol is stored may be read more than once. Multiple reads of the channel 114 corresponding to the same symbol may be processed by the detector 120 to generate detector sample 122 in the form of reliability data and hard decision data. For example, in a binary code, multiple reads of the channel 114 may be processed by the demodulator 116, the detector 118, or both to generate one bit of hard decision data and one bit of reliability data for each bit in the sample codeword. In another example, two bits of reliability data may be generated for each bit in the sample codeword. Such reliability data may be stored in a "reliability data memory" location that is separate from the hard decision memory, or may be stored together with the hard decisions in the same memory location. Both hard decision and reliability data in the form of detector sample 122 are transmitted to a decoder 124 as input for subsequent decoding operations.

The decoder 124 receives and iteratively processes the detector sample 122. The detector 120 and the decoder 124 may be two separate processors, or a single processor may be used as both the detector 120 and decoder 124. In general, the decoder 124 comprises control circuitry and/or decoding circuitry used to iteratively correct and/or detect errors present in the detector sample 122, for example, due to transmission through the channel 114. In some embodiments, the decoder 124 uses the parity check matrix H 126 and a decoding technique to produce a decoded message 128. In general, LDPC decoding can be described using a mathematical vector model $Hc = \vec{0}$, in which c is a binary string of length n and H is the parity check matrix H 126, which is a low-density, sparse m×n matrix, wherein, as above, n is the number of symbols in the codeword, m is the number of check nodes satisfying m≥n−k, and k is the number of symbols in the message. The model is satisfied only when the binary string c is the codeword $\underline{c}$ 110. The parity check matrix H 126 is not necessarily unique, and may be chosen to be computationally convenient, to decrease the number of errors generated by the decoding technique of the decoder 124, or both.

The length of time that the decoder 124 has to wait before the decoding process can begin is dependent on the number of reads that are performed and the amount of reliability data that is expected to be received. In accordance with the present disclosure, the decoder 124 receives partial reliability data from the detector 120 and processes the partial reliability data to initiate the decoding process. Partial reliability data may result because the reliability data is corrupted or only partially available to the decoder 124. This may occur when the channel between the detector 120 and the decoder 124 has poor channel conditions that corrupt the reliability data. For example, the channel between the detector 120 and the decoder 124 may be a lossy channel that loses at least some of the reliability data during transmission to the decoder 124. Alternatively, partial reliability data (instead of all of the reliability data) may be purposely provided to the decoder 124 to shorten the amount of time that the decoder has to wait before initiating or continuing a decoding process.

The present disclosure describes systems and methods implemented by the decoder 124 to process and make use of the partial reliability data. In some embodiments, the decoder 124 uses an iterative decoding technique that involves processing detector samples 122 by updating symbols, reliability data, or both based on one or more "update rules." In an example, an update rule may be based on whether checks of the symbol are satisfied or unsatisfied, whether the symbol has been previously updated, flipped, or toggled, based on the value of the reliability data, or a suitable combination thereof. Generally, as used herein, "flipping" or "toggling" a symbol means to update a value of the symbol to a different value than the current value. Unlike conventional bit flipping decoders of LDPC codes that typically work on hard decision inputs only, bit flipping decoders with reliability inputs or partial reliability inputs may improve the performance of the decoder, reduce the total number of decoding iterations required to reach convergence, or both. Systems and methods for flipping decoders with reliability inputs are described in detail in Varnica et al. U.S. patent application Ser. No. 14/172,420, filed Feb. 4, 2014, which is hereby incorporated by reference herein in its entirety. The rules for flipping decoders may be adjusted or optimized based on the partial reliability data that is received. For example, one set of rules may be used for flipping decoders that receive the full set of reliability data, while a different set of rules may be used for flipping decoders that receive a partial set or a compressed set of the reliability data.

After processing, each symbol in the decoded message 128 should be assigned as one state in a set of possible states. When input into the model $\vec{Hc}=\vec{0}$ as c, the decoded message 128 satisfies the model.

The decoded message 128 is delivered to the receiving user or application 130 after being processed by the decoder 124. The receiving user or application 130 may correspond to the same device or entity as the transmitting user or application 102, or the receiving user or application 130 may correspond to a different device or entity. Further, the receiving user or application 130 may be either co-located or physically separated from the transmitting user or application 102. If the decoder 124 corrects all errors that are induced by the channel 114 and other communications effects in the communications system 100, then the decoded message 128 is a logical replica of the message 104. Otherwise, the decoded message 128 may differ from the message 104, and the decoder 124 may declare an error accordingly.

Figure 2:
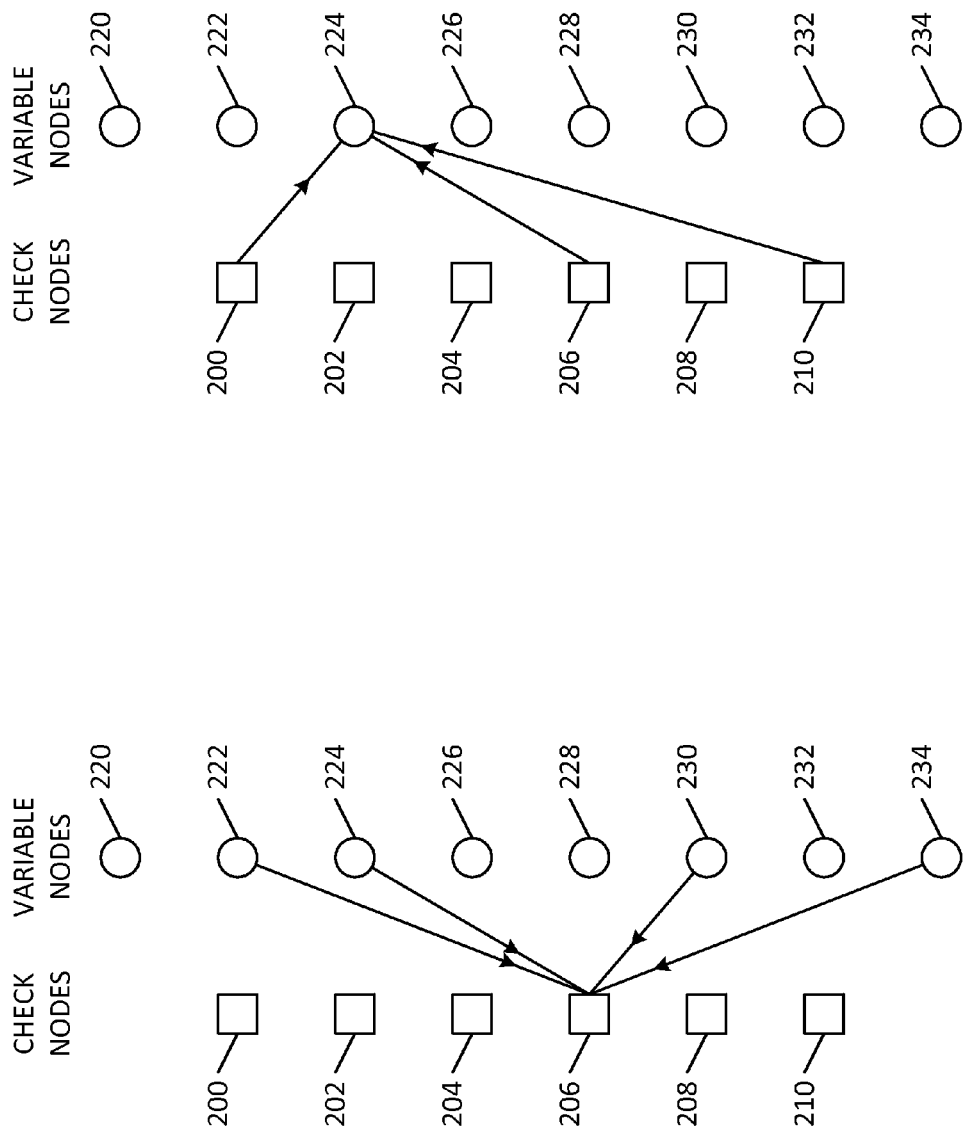
FIGS. 2A and 2B are graphical illustrations of communications between variable nodes representing symbols of a received codeword and check nodes for decoding the received codeword, in accordance with an embodiment of the present disclosure.

FIGS. 2A and 2B are graphical illustrations of communications between variable nodes 220-234 representing an example codeword and check nodes 200-210 for decoding the codeword using variable reliability information, in accordance with an embodiment of the present disclosure.

Upon initialization of the decoding process, variable nodes 220-234 are assigned input states using the detector 120 as described in relation to FIG. 1, where both hard decision and reliability information are taken into account. As discussed herein, a "variable value" refers to the hard decision associated with a variable node, while "variable reliability data" refers to the reliability data associated with the variable node or variable value. An input state may include one or both of the variable value and the variable reliability data.

In one illustrative example, every variable node is associated with a two-bit input denoted by [$b_1$ $b_0$], where the value of the bit $b_0$ indicates the hard decision and the value of the bit $b_1$ indicates the reliability of the hard decision. In a binary code, $b_0$ may take on values 0 or 1, representing the two possible hard decision states of a decoded bit. Correspondingly, $b_1$ may also take on values 0, 1, or X, where 0 represents an unreliable hard decision, 1 represents a reliable hard decision, and X represents unavailable reliability data. The unavailable reliability data (represented by X) may result from the set of reliability bits that are not transmitted to the decoder 124. This may occur due to compression schemes or poor channel conditions. The decoder 124 may treat the unavailable reliability data as erased data.

In other words, an input of 10 to a variable node may be interpreted as a reliable decision of 0, an input of 00 to a variable node may be interpreted as an unreliable decision of 0, an input of 01 to a variable node may be interpreted as an unreliable decision of 1, an input of 11 to a variable node may be interpreted as a reliable decision of 1, an input of X0 to a variable node may be interpreted as a decision of 0 without any reliability information, and an input of X1 to a variable node may be interpreted as a decision of 1 without any reliability information. The hard decision and reliability data input may be stored together in one memory location as input states, or separately in a hard decision memory and a reliability data memory. As described herein, only one bit is used to represent the hard decision and only one bit is used to represent the reliability of the hard decision. However, in general, any number of bits may be used to represent the hard decision, the reliability, or both. In particular, the hard decision may take on more than two values for non-binary codes, and the reliability messages may carry one or more bits or symbols. Moreover, when the reliability information may be unavailable, more than one bit may be used to store the reliability (i.e., to store the 0 when the hard decision is unreliable, 1 when the hard decision is reliable, or X when reliability information regarding the hard decision is unavailable).

After the variable nodes 220-234 are assigned input states using the detector 120 as described in relation to FIG. 1, a check of the variable nodes is performed by the decoder 124 on a plurality of groups of variable nodes. The decoder 124 uses processing rules to determine a condition of a group of variable nodes. An indication of the determined condition is stored in syndrome memory at a check node, such as check nodes 200-210. The parity check matrix H 126 (FIG. 1) identifies which check nodes store indications of the determined conditions for which variable nodes. For example, for the nodes pictured in FIGS. 2A and 2B and for a binary code example, the parity check matrix H 126 may be as follows $$H = \begin{bmatrix} 1 & 0 & 1 & 0 & 1 & 1 & 0 & 0 \\ 0 & 1 & 0 & 1 & 0 & 1 & 1 & 0 \\ 1 & 0 & 0 & 1 & 1 & 0 & 1 & 0 \\ 0 & 1 & 1 & 0 & 0 & 1 & 0 & 1 \\ 0 & 1 & 0 & 0 & 1 & 0 & 1 & 1 \\ 1 & 0 & 1 & 1 & 0 & 0 & 0 & 1 \end{bmatrix}$$

Each row corresponds to one of the check nodes, and each column corresponds to one of the variable nodes. With binary codes, the elements of the parity check matrix are 0 or 1, as shown above. As used herein, a "neighboring" check node of a variable node is a check node that has a connection to the variable node. Similarly, a "neighboring" variable node of a check node is a variable node that has a connection to the check node. The parity check matrix H 126 shown above provides indications of the connections between check nodes and variable nodes. In particular, as shown in FIG. 2A, variable nodes 222, 224, 230, and 234 are neighbors of check node 206, and as shown in FIG. 2B, check nodes 200, 206, and 210 are neighbors of variable node 224. Furthermore, in binary codes, each check node has one of two states, 0 if the check is satisfied, and 1 if the check is unsatisfied. For a non-binary code, the elements of the parity check matrix are non-binary, and each check node has one of more than two states. Each row of the parity check matrix forms the coefficients of a parity check equation, which is computed in the non-binary domain. In some embodiments, each check node is further associated with one or more bits of check reliability data. For example, if the majority of variable nodes associated with a check node have unreliable variable values, the computed check node value may be flagged as unreliable. The reliability of the check node value may be represented by a corresponding single bit of check reliability data. In some embodiments, more than one bit of check reliability data is stored in a check reliability memory and updated through the decoding process. The check reliability memory may be implemented together with or separated from the syndrome memory. While check reliability data may improve the performance of the decoder, a system that uses check reliability data consumes more power than a system that does not use check reliability data. Thus, a trade-off between decoding performance and power consumption may be considered when determining whether to use check reliability data.

The decoder 124 references the parity check matrix H 126 to identify variable nodes associated with a particular check node, or variable nodes that should be checked by the particular check node. For example, for the check node 206, the decoder 124 uses fourth row of the parity check matrix H 126 to determine that that check node 206 stores the result of a check of variable nodes 222, 224, 230, and 234 (i.e., the second, third, sixth, and eighth variable nodes). Then, the decoder 124 retrieves the values stored in these variable nodes. The values in the fourth row of the above parity check matrix H are the coefficients of a parity check equation, which are each multiplied by the corresponding values of the variable nodes. For illustration, the arrows in FIG. 2A indicate that the retrieved values flow from the variable nodes 222, 224, 230, and 234 to the check node 206, and the check node 206 may be considered to "check" the variable nodes 222, 224, 230, and 234. The variable node values are retrieved by the decoder 124, which processes the values on behalf of the check node 206 according to the processing rules.

From the values received from the variable nodes 222, 224, 230, and 234, the decoder 124 determines whether a given condition for the check node 206 is satisfied or is unsatisfied. An indication of whether the check node 206 is satisfied or unsatisfied (i.e., the "syndrome value" or the "check node value" of the check node) is stored in syndrome memory, which stores syndrome values or indications of the check nodes. In addition, reliability of the syndrome values of the check nodes may be updated based on values and reliability of associated variable nodes.

After the indications or syndrome values for the check nodes 200-210 have been stored in the syndrome memory, the values of the variable nodes 220-234 may be updated based on the values of the check nodes and reliability of the variable nodes. The parity check matrix H 126 is again used by the decoder 124 to determine which check nodes should be accessed for a particular variable node. As illustrated in FIG. 2B, for updating the variable node 224, the parity check matrix H 126 given above indicates that check nodes 200, 206, and 210 (i.e., the first, fourth, and sixth check nodes) should be referenced. Based on the indications of the referenced check nodes, the state of the variable node 224 may be updated.

Figure 3:
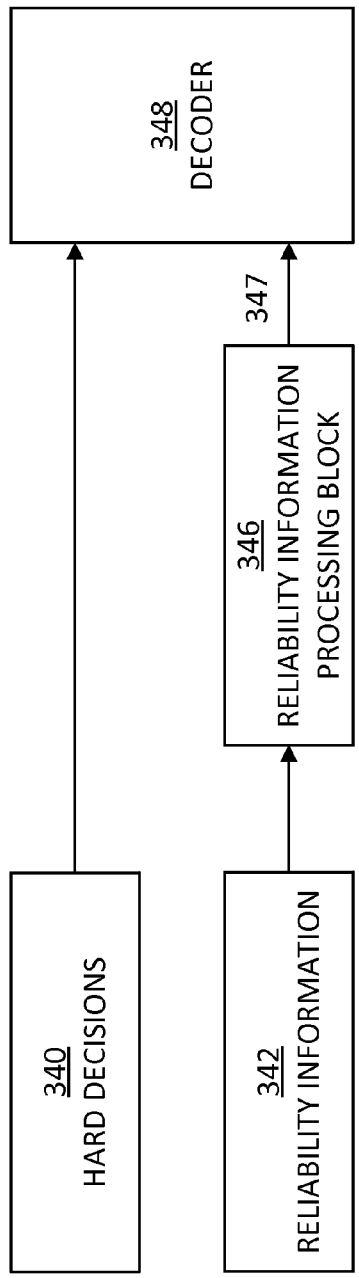
FIG. 3 is a block diagram of an illustrative system for LDPC decoding based on processed reliability information, in accordance with an embodiment of the present disclosure.

FIG. 3 is a block diagram of an illustrative system 300 for LDPC decoding based on processed reliability information, in accordance with an embodiment of the present disclosure. System 300 includes hard decisions 340, reliability information 342, a reliability information processing block 346, and a decoder 348. Decoder 348 may be the same as decoder 124 shown and described in relation to FIG. 1.

As shown in FIG. 3, decoder 348 receives hard decisions 340 and processed reliability information 347 from reliability information processing block 346, which receives and processes reliability information 342. Reliability information processing block 346 effectively shortens the amount of time that is needed to transfer the reliability information from the device cache to the decoder 348. This allows decoder 348 to initiate or continue a decoding process at an earlier time than if all of the reliability information 342 were to be transmitted to decoder 348. Advantageously, providing processed reliability information 347 to decoder 348 saves time and increases the efficiency of the decoding process without sacrificing a significant amount of performance. The amount of compression or processing performed on the reliability information 342 to obtain the processed reliability information 347 may be adjusted depending on a desired tradeoff between efficiency and performance of the decoding process.

In particular, in a NAND flash device, after a read command is executed, the reliability information from the read command may be stored in a cache on the device. For example, the reliability information 342 may include mostly 1s, indicating that most of the hard decisions are reliable. For example, the reliability information 342 may further only include a small number of 0s (such as 3-5%, 1-10%, or any other suitable range or percentage of 0s), indicating that only a few of the hard decisions are unreliable. When this is the case, reliability information processing block 346 may process reliability information 342 to reduce the amount of transfer time between the cache and decoder 348. It may be desirable to compress reliability information 342 rather than hard decisions 340 because reliability information 342 may tend to have only a small number of 0s indicating unreliable hard decisions. In contrast, hard decisions 340 are more likely than reliability information 342 to have an approximately equal number of 0s and 1s, and is therefore less compressible than reliability information 342. Thus, it may be desirable to provide all of unprocessed hard decisions 340 to decoder 348 while providing processed reliability data 347 to decoder 348.

When reliability information processing block 346 processes reliability information 342 to produce processed reliability information 347, the processed reliability information 347 represents a corrupted version of reliability information 342 or only partial reliability information. By providing less than the full amount of reliability information 342 to decoder 348, reliability information processing block 346 effectively shortens the time delay that the decoder 348 has to wait before decoding and advantageously enhances the efficiency of the decoding process. In some embodiments, reliability information processing block 346 receives and jointly processes both hard decisions 340 and reliability information 342. In particular, joint processing of both hard decisions 340 and reliability information 342 may be performed when the hard decisions are compressible. In an example, hard decisions 340 may include significantly more zeroes than ones (or significantly more ones than zeroes). In this case, hard decisions 340 and reliability information 342 may be combined to form symbols, and compression may be performed on the symbols.

When only a partial set of reliability information 347 is provided to decoder 348, decoder 348 may use a set of bit or symbol updating rules during the decoding process that is different from the rules that are used when the decoder 348 receives the full set of reliability information 342. For example, when decoder 348 receives only a partial set of reliability information 347, decoder 348 may select to flip a bit during the iterative decoding process that would not have been flipped if the full reliability information 342 was received. In particular, when reliability information is corrupted (or otherwise unavailable), the reliability information may be associated with a lower confidence level than uncorrupted reliability information. In an example, a first update rule may be used when full reliability information is available, and a second update rule may be used when reliability information is corrupted or otherwise unavailable. In this case, the first and second update rules may be different in that compared to the first update rule, the second update rule may make it easier to update reliable variable nodes and more difficult to update unreliable variable nodes. In other words, the second update rule may have a lower threshold for updating reliable variable nodes and a higher threshold for updating unreliable variable nodes. This may be desirable because the corrupted (or unavailable) reliability data has a lower confidence level than uncorrupted (or available) reliability data. In particular, when reliability information is not available for one or more variable nodes, the reliability data may have different levels of confidence (i.e., 0 for confidently unreliable, 1 for confidently reliable, and X for not confident), and the update rules used by decoder 348 may be different for each level of confidence.

Figure 4:
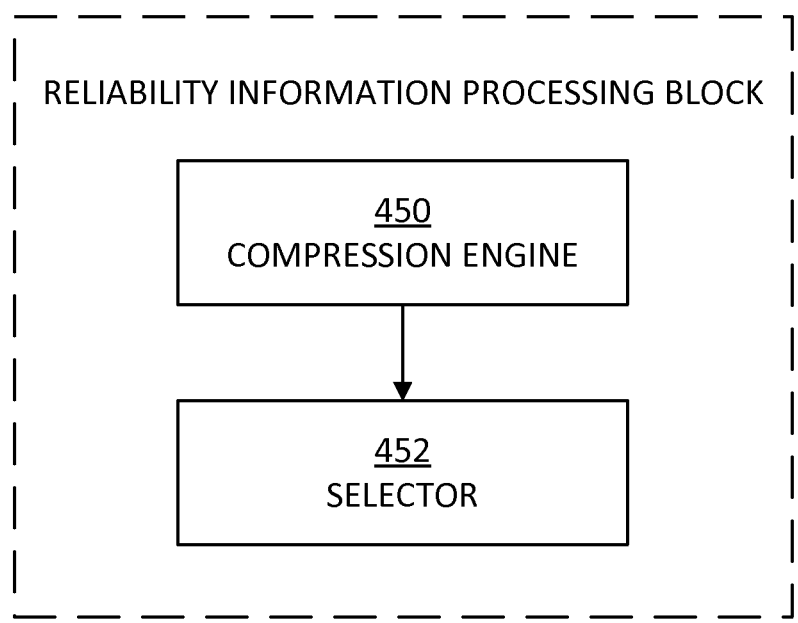
FIG. 4 is a block diagram of an illustrative system for processing reliability information for transmission to a decoder, in accordance with an embodiment of the present disclosure.

FIG. 4 is a block diagram of an illustrative system 400 for processing reliability information, in accordance with an embodiment of the present disclosure. The reliability information processing block shown in FIG. 4 may be the same as reliability information processing block 346 shown and described in relation to FIG. 3. In particular, the reliability information processing block includes a compression engine 450 and a selector 452. In some embodiments, when compression engine 450 is activated for compressing received reliability information, selector 452 is deactivated. In some embodiments, when selector 452 is activated for selecting a subset of the received reliability information, compression engine 450 is deactivated.

In some embodiments, compression engine 450 receives the full set of reliability information 342 and provides a compressed version of the reliability information 342 to selector 452. For example, when the reliability information 342 is complete and is not distorted, omitted, or erased, compression engine 450 may compress the reliability information 342 and provide a smaller amount of data to selector 452, which may then select some or all of the compressed reliability information for transmission to decoder 348.

Compression engine 450 may use any compression scheme, including lossless or lossy schemes, to compress the received reliability information 342 to form compressed reliability information. In some embodiments, the compression scheme is lossless, such that the full set of reliability information 342 may be recovered in a decompressor from the compressed reliability information. In an example of a lossless compression scheme, when the reliability information is a string of 0s and is (or 0s, is, and Xs, where "X" indicates that the reliability information is unavailable), the compressed reliability information may include a reduced set of symbols. For example, the compressed reliability information may indicate a symbol value (0, 1, or X) and a number of times that symbol value occurs consecutively in the string of the uncompressed reliability information 342. When the reliability information is mostly 1s, indicating reliable hard decisions, this type of scheme may save costs by reducing transmission time without sacrificing decoding performance at decoder 348.

In some embodiments, it may be desirable to use a compression scheme that is lossy, such that the full set of reliability information 342 may not be recovered from the compressed reliability information. In contrast to lossless compression schemes, at least some fraction of the reliability information is distorted at the output of the decompressor for lossy compression schemes. However, lossy compression schemes generally allow for more effective compression ratios than lossless compression schemes. In the tradeoff between efficiency and performance, lossy compression schemes allow for an amount of performance to be sacrificed in favor of efficiency and reduced transmission times. In an example, a lossy compression scheme may drop or remove some of the bits or symbols in the reliability information 342, such that the removed bits or symbols are unrecoverable at decoder 348.

In some embodiments, compression engine 450 does not perform any processing on the received reliability information 342, and the only processing performed by reliability information processing block 346 is performed by selector 452. In this case, selector 452 may selectively exclude certain bits or symbols in the reliability information 342 from being transmitted to decoder 348. In this case, decoder 348 may be configured to recognize which bits or symbols were excluded from the processed reliability information 347 that decoder 348 receives, and treats the excluded symbols as erasures.

Figure 5:
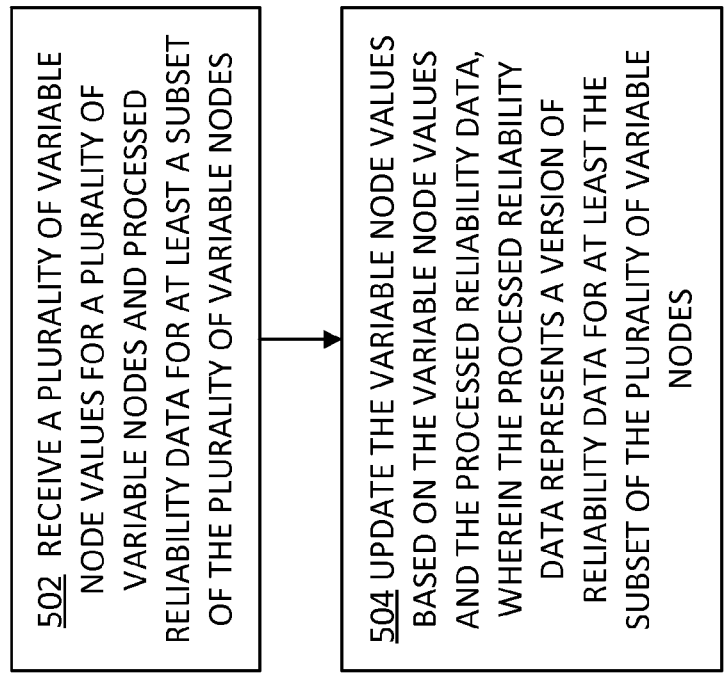
FIG. 5 is a flowchart of an illustrative process for decoding data using processed reliability information, in accordance with an embodiment of the present disclosure.

FIG. 5 shows a high level flow chart for a process 500 for decoding based on processed reliability data, in accordance with an embodiment of the present disclosure. A decoder similar to any of decoders 124 or 348 may execute process 500.

At 502, a plurality of variable node values for a plurality of variable nodes and processed reliability data for at least a subset of the plurality of variable nodes are received. In an example, the reliability data are stored in a memory and are compressed to obtain the processed reliability data. As described above, compressed reliability data may be provided to a decoder to reduce a transmission time between the memory and the decoder, such that the decoder may initiate the decoding process earlier than if the reliability data were not compressed. The compression scheme that is used by a processor, such as reliability information processing block 346 or compression engine 450, for example, may be lossless or lossy.

In an example, a subset of the reliability data are selected and form the processed reliability data. In this case, compression engine 450 may be deactivated and reliability information processing block 346 may only include a selector such as selector 452 that selects the subset of the reliability data. In this case, the remaining portion of the reliability data that was not selected by selector 452 may be treated by decoder 124 or 348 as erased data during the decoding process. In some embodiments, the variable node values (i.e., hard decisions 340) are jointly compressed with the reliability data to obtain the processed reliability data. In some embodiments, the processed reliability data represents a corrupted version of the full set of unprocessed reliability data.

At 504, the variable node values are updated based on the variable node values and the processed reliability data, wherein the processed reliability data represents a partial version of reliability data for at least the subset of the plurality of variable nodes. The updating may be based on an iterative LDPC decoding scheme that iteratively updates variable node values in accordance with one or more update rules. Decoders that use these update rules may be referred to herein as bit flipping decoders. In particular, when a bit flipping decoder receives a full set of unprocessed (i.e., uncompressed) reliability information, the decoder uses one set of bit flipping update rules. The bit flipping update rules may be different when the bit flipping decoder receives the processed reliability information, which may include compressed reliability data, a selected subset of reliability data, or both. While the decoding described herein is described specifically with respect to LDPC decoding, one of ordinary skill in the art will understand that the systems and methods of the present disclosure may be applied to any type of decoder.

While various embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the disclosure. It is intended that the following claims define the scope of the disclosure and that methods and structures within the scope of these claims and their equivalents be covered thereby.

What is claimed is:

1. A method for decoding data, comprising:
   receiving a partial set of reliability data over a channel, wherein the partial set of reliability data is associated with a subset of a plurality of variable nodes, and wherein a remaining portion of reliability data not in the partial set of reliability data is corrupted by a condition of the channel;
   receiving a plurality of variable node values for the plurality of variable nodes;
   determining processed reliability data for at least the subset of the plurality of variable nodes, wherein the processed reliability data indicates whether reliability data associated with each variable node of the plurality of variable nodes is included in the partial set of reliability data; and
   updating the plurality of variable node values based on the plurality of variable node values and the processed reliability data, wherein the processed reliability data represents a version of reliability data for at least the subset of the plurality of variable nodes.

2. The method of claim 1, further comprising storing the partial set of reliability data in a memory and compressing the partial set of reliability data to obtain the processed reliability data.

3. The method of claim 1, further comprising compressing the partial set of reliability data using a lossless compression scheme to obtain the processed reliability data.

4. The method of claim 1, further comprising compressing the partial set of reliability data using a lossy compression scheme to obtain the processed reliability data.

5. The method of claim 1, wherein the remaining portion of reliability data not in the partial set of reliability data is treated as a set of erasures during the updating.

6. The method of claim 1, further comprising jointly compressing the plurality of variable node values and the partial set of reliability data to obtain the processed reliability data.

7. The method of claim 1, wherein the updating the plurality of variable node values based on the plurality of variable node values and the processed reliability data comprises applying at least one update rule that is determined based on a type of the processed reliability data.

8. The method of claim 1, wherein the decoding is low density parity check decoding, and the reliability data is stored on a cache of a NAND flash device.

9. The method of claim 1, wherein updating the plurality of variable node values further comprises:
   determining whether a variable node of the plurality of variable nodes is in the subset of the plurality of variable nodes;
   in response to determining that the variable node is not in the subset of the plurality of variable nodes, updating a variable node value associated with the variable node based on a first update rule; and
   in response to determining that the variable node is in the subset of the plurality of variable nodes, updating the variable node value associated with the variable node based on a second update rule.

10. A decoder comprising decoding circuitry configured to:
    receive a partial set of reliability data over a channel, wherein the partial set of reliability data is associated with a subset of a plurality of variable nodes, and wherein a remaining portion of reliability data not in the partial set of reliability data is corrupted by a condition of the channel;
    receive a plurality of variable node values for the plurality of variable nodes;
    determining processed reliability data for at least the subset of the plurality of variable nodes, wherein the processed reliability data indicates whether reliability data associated with each variable node of the plurality of variable nodes is included in the partial set of reliability data; and
    update the plurality of variable node values based on the plurality of variable node values and the processed reliability data, wherein the processed reliability data represents a version of reliability data for at least the subset of the plurality of variable nodes.

11. The decoder of claim 10, wherein the partial set of reliability data is stored in a memory and the partial set of reliability data is compressed to obtain the processed reliability data.

12. The decoder of claim 10, wherein the partial set of reliability data is compressed using at least one of a lossy compression scheme or a lossless compression scheme to obtain the processed reliability data.

13. The decoder of claim 10, wherein the decoder treats the remaining portion of reliability data not in the partial set of reliability data as a set of erasures.

14. The decoder of claim 10, wherein the plurality of variable node values and the partial set of reliability data are jointly compressed to obtain the processed reliability data.

15. The decoder of claim 10, wherein the circuitry updates the plurality of variable node values based on the plurality of variable node values and the processed reliability data by applying at least one update rule that is determined based on a type of the processed reliability data.

16. The decoder of claim 10, wherein the decoder is a low density parity check decoder, and the reliability data is stored on a cache of a NAND flash device.

17. The decoder of claim 10, wherein the decoding circuitry is configured to update the plurality of variable node values by:
   determining whether a variable node of the plurality of variable nodes is in the subset of the plurality of variable nodes;
   in response to determining that the variable node is not in the subset of the plurality of variable nodes, updating a variable node value associated with the variable node based on a first update rule; and
   in response to determining that the variable node is in the subset of the plurality of variable nodes, updating the variable node value associated with the variable node based on a second update rule.

18. A method for providing processed reliability data to a decoder, the method comprising:
   receiving a partial set of reliability data for a subset of a plurality of variable nodes, wherein a remaining portion of reliability data not in the partial set of reliability data is corrupted by a condition of a channel used to receive the partial set of reliability data;
   processing the partial set of reliability data to obtain a processed version of reliability data for the plurality of variable nodes that indicates whether the reliability data associated with each variable node in the plurality of variable nodes is included in the partial set of reliability data; and
   transmitting the processed version of the reliability data to a decoder.

* * * * *